(12) United States Patent
Fukui et al.

(10) Patent No.: US 6,657,290 B2
(45) Date of Patent: Dec. 2, 2003

(54) SEMICONDUCTOR DEVICE HAVING INSULATION LAYER AND ADHESION LAYER BETWEEN CHIP LAMINATION

(75) Inventors: Yasuki Fukui, Sakai (JP); Atsuya Narai, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/044,973

(22) Filed: Jan. 15, 2002

(65) Prior Publication Data
US 2002/0096755 A1 Jul. 25, 2002

(30) Foreign Application Priority Data

Jan. 24, 2001 (JP) .......................... 2001-016420

(51) Int. Cl.[7] .......................... H01L 23/48; H01L 29/40; H01L 23/02
(52) U.S. Cl. .......................... 257/686; 257/777; 257/685; 257/723; 257/78; 257/737; 257/738; 257/784; 257/786; 257/787
(58) Field of Search .......................... 257/686, 685, 257/777, 778, 786, 787, 784, 737, 734, 738, 723, 730

(56) References Cited

U.S. PATENT DOCUMENTS

| RE36,613 E | 3/2000 | Ball | 257/777 |
|---|---|---|---|
| 6,100,594 A | 8/2000 | Fukui et al. | 257/777 |
| 6,333,562 B1 * | 12/2001 | Lin | 257/777 |
| 6,340,846 B1 * | 1/2002 | LoBianco et al. | 257/777 |
| 6,387,728 B1 * | 5/2002 | Pai et al. | 438/106 |
| 6,437,449 B1 * | 8/2002 | Foster | 257/777 |
| 2001/0012643 A1 * | 8/2001 | Asada | 438/107 |
| 2002/0014689 A1 * | 2/2002 | Lo et al. | 257/686 |
| 2002/0024146 A1 * | 2/2002 | Furussawa | 257/777 |
| 2002/0027295 A1 * | 3/2002 | Kikuma et al. | 257/780 |
| 2002/0030263 A1 * | 3/2002 | Akram | 257/686 |
| 2002/0096785 A1 * | 7/2002 | Kimura | 257/778 |

FOREIGN PATENT DOCUMENTS

| JP | 6-244360 A | 9/1994 |
|---|---|---|
| JP | 10-27880 A | 1/1998 |

* cited by examiner

Primary Examiner—Alexander O. Williams
(74) Attorney, Agent, or Firm—Nixon & Vanderhye P.C.

(57) ABSTRACT

A semiconductor device includes a first semiconductor chip and a second semiconductor chip which are laminated on a substrate, wherein electrode terminals which are provided on each of the semiconductor chips are electrically connected to the substrate by first bonding wires and second bonding wires, and an insulation layer is formed between the second bonding wires and the first semiconductor chip.

14 Claims, 16 Drawing Sheets

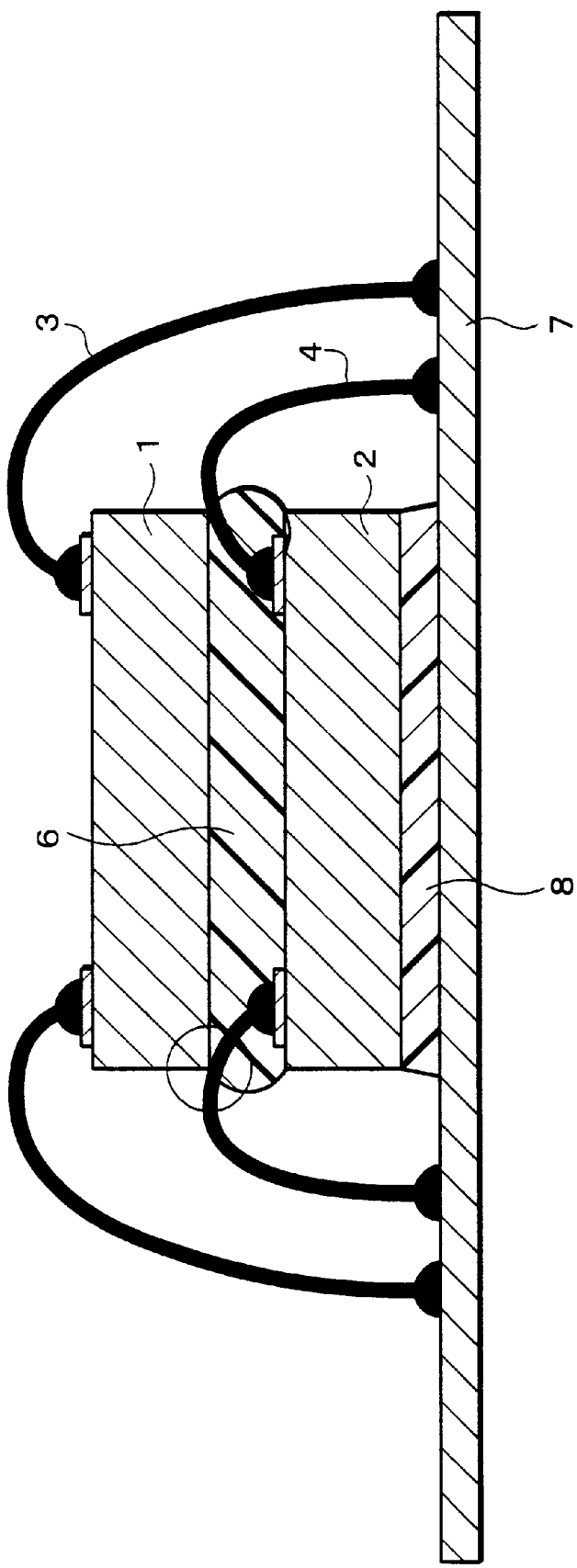

SEMICONDUCTOR DEVICE HAVING INSULATION LAYER AND ADHESION LAYER BETWEEN CHIP LAMINATION

FIELD OF THE INVENTION

The present invention relates to a semiconductor device, and in particular to a semiconductor device which is equipped with a plurality of semiconductor chips laminated in a single package and manufacturing method of such a semiconductor device.

BACKGROUND OF THE INVENTION

In recent years, the downsizing and the improvement in terms of performance regarding a semiconductor device have been attempted by equipping a plurality of semiconductor chips (semiconductor elements) in a single package. For example, a package is equipped with a plurality of semiconductor chips laminated thereon for the purpose of adding an extra value to a memory which is equipped in a portable device or the like, or increasing its memory space.

A semiconductor device is made up of a semiconductor chip and a substrate. As a method of connecting these electrically, a wire bonding method is widely adopted, which makes a connection using bonding wires.

In the case of adopting the wire bonding method for connecting a semiconductor chip with a substrate, it is necessary to prevent damage to the wire bonded part of the semiconductor chip which was previously mounted on a substrate. Namely, the wire bonded part will not be damaged when the chip size of the laminating semiconductor chip is smaller than that of the semiconductor chip which was previously mounted on the substrate. However, in the case where the chip sizes of the two semiconductor chips are substantially the same, the wire bonded part overlaps the laminating semiconductor chip, thereby causing a problem that the bonded part is most likely to be damaged.

In order to solve the problem, the semiconductor devices described below have been proposed. A semiconductor device having a spacer of about 200 μm (0.008 inch) sealed between the laminated semiconductor chips (U.S. Pat. No. Re. 36,613). A semiconductor device having an irregular structure in which the periphery is thinner than the center (Japanese Unexamined Patent Publication No. 244360/1994 (Tokukaihei 6-244360 published on Sep. 2, 1994). A semiconductor device which has an adhesion layer between the laminated semiconductor chips (Japanese Unexamined Patent Publication No. 27880/1998 (Tokukaihei 10-27880 published on Jan. 27, 1998).

However, these conventional semiconductor devices respectively cause problems described below.

In the semiconductor device having a spacer sealed between the laminated semiconductor chips, it is necessary to use a spacer having an adequate thickness for preventing contact between bonding wires connected to a semiconductor chip which is mounted on a substrate, and the laminating semiconductor chip. Thus, there is a problem that it is not suitable for downsizing the package.

Namely, as shown in FIG. 13, it is necessary to use a spacer 14 having an adequate thickness for preventing the contact between a second bonding wire 4 which connects a second semiconductor chip 2 and a substrate 7, and a first semiconductor chip 1. In other words, in the case where the spacer 14 is not thick enough to prevent contact between the highest part of the second bonding wire 4 from the second semiconductor chip 2 and the first semiconductor chip 1 as shown in FIG. 14, there arises a problem of inadequate insulation between the second bonding wire 4 and the first semiconductor chip 1.

Further, the first semiconductor chip 1 overhangs as shown in FIG. 13. In other words, the first semiconductor chip 1 protrudes from the spacer 14. Therefore, vibration is likely to occur on the first semiconductor chip 1. Here, in the wire bonding method which electrically connect a semiconductor chip to a substrate, two connecting processes are performed so as to connect both ends of a bonding wire, and the second connection is performed by ultrasonic wave vibration. As mentioned, since vibration is likely to occur on the first semiconductor chip 1, it is difficult to connect the first bonding wire 3 to the first semiconductor chips 1 by ultrasonic wave vibration. Consequently, it is necessary to connect one end of the first bonding wire 3 to the substrate 7 after connecting the other end of the first bonding wire 3 to the first semiconductor chip 1.

Namely, only the forward wire bonding method can be used for the wire bonding of the first semiconductor chip 1 which is mounted on the spacer 14. Accordingly, wire bonding terminals of the substrate 7 are required to be disposed more toward the edge of the substrate 7 in comparison with the case adopting the reverse wire bonding method. This results in a problem such that it is difficult to downsize the package. Note that, the forward wire bonding method is a method of connecting bonding wires and a substrate after connecting a semiconductor chip and the bonding wires. The reverse wire bonding method is a method of performing the connection in the reversed order.

As shown in FIG. 15, in the case of a semiconductor device having an irregular structure in which the periphery is thinner than the center, an extra cutting operation which cuts a semiconductor wafer to form irregularities is required in addition to the cutting operation of a semiconductor chip in comparison with the conventional process. Further, in the cutting operation, it is necessary to protect the opposite side of the surface on which the cutting operation is performed, i.e., the side on which elements bearing side of the semiconductor chip. This results in the problem of increased manufacturing cost.

Further, in this semiconductor device, the irregularities of the ninth semiconductor chip 51 are not insulated. Therefore, as shown in FIG. 16, there arises a problem of inadequate insulation between the second bonding wire 4 and the ninth semiconductor chip 51 when they contacted with each other in downsizing the package. Further, when the thickness of the ninth semiconductor chip 51 is reduced, the irregularities also become thin and the strength becomes weak. This may result in deficiencies such as a chip crack.

As with the structure having a spacer sealed between the laminated semiconductor chips, only the forward wire bonding method can be used for the wire bonding of the semiconductor chip having irregularities with the substrate. In using the forward wire bonding method, the height of the bonding wire to the semiconductor chip cannot be reduced, thereby posing a problem of difficulty in downsizing a semiconductor device when a plurality of semiconductor chips are laminated.

Further, as described, since only the forward wire bonding method is can be used, the wire bonding terminals of the substrate 7 are required to be disposed more toward the edge of the substrate 7, in comparison with the case adopting the reverse wire bonding method. This results in a problem of difficulty in downsizing a package.

As shown in FIG. 17, in the case of a structure which has an adhesion layer between the laminated semiconductor chips, it is difficult to control the thickness and the area of an adhesion layer 6 which adheres the first semiconductor chip 1 to the second semiconductor chip 2. This results in a problem of contamination of a substrate 7 by seeping (bleeding) of the adhesive which makes up the adhesion layer 6, or a problem of a tilt which occurs on the laminated first semiconductor chip 1.

Especially, in the case of laminating a plurality of semiconductor chips, stable production becomes difficult because the variation of height of the semiconductor device, the variation of height from the substrate to the surface of the top semiconductor chip, and the tilt of the top semiconductor chip increase. Namely, while the problem of variation and height does not become serious when laminating two semiconductor chips, the problem becomes serious as the number of the laminating chips becomes larger, such as three or four, because in this case the variation of height and the tilt increase to cause the problem of difficulty in stable production.

Further, as shown in FIG. 18, there also arises the problem of inadequate insulation between the second bonding wire 4 and the first semiconductor chip 1 when they contacted with each other in downsizing the package.

The present invention was made to solve the foregoing problems, and an object of the present invention is to provide a semiconductor device having ensured insulation and is capable of laminating semiconductor chips regardless of the chip size, and the manufacturing method thereof.

SUMMARY OF THE INVENTION

It is an object of the present invention to provide a semiconductor device having ensured insulation and is capable of laminating semiconductor chips regardless of the chip size, and a manufacturing method thereof.

In order to attain the foregoing object, a semiconductor device and a manufacturing method according to the present invention, a method of laminating semiconductor chips which have been prepared by dividing (cutting) a semiconductor wafer by dicing in a state where a resin layer of a bi-layer structure, which is made up of an insulation layer and an adhesion layer is affixed on the semiconductor wafer.

This makes it possible to manufacture a semiconductor device having small outer dimensions and ensured insulation with high productivity. Further, in the semiconductor device, the semiconductor chips can be laminated without avoiding the bonding wire part when laminating semiconductor chips, thereby laminating the semiconductor chips regardless of the chip size.

In order to attain the foregoing object, the semiconductor device according to the present invention includes a plurality of semiconductor chips which are laminated on a substrate, and electrode terminals provided on each semiconductor chip, which are electrically connected to the substrate by bonding wires, wherein an insulation layer is formed between the bonding wires and the semiconductor chip which is laminated on the semiconductor chip to which the bonding wires are connected.

With the foregoing arrangement, it is possible to prevent contact between the bonding wires and semiconductor chips. This ensures insulation of the semiconductor device having a plurality of laminated semiconductor chips.

In the semiconductor device having a plurality of laminated semiconductor chips, the semiconductor chips which are laminated on the substrate, are electrically connected to the substrate by the bonding wires via the electrode terminals which are provided on each of the semiconductor chip. Here, it is necessary to prevent contact between the bonding wires and semiconductor chips so as to ensure insulation of the semiconductor device. Especially, in order to downsize the semiconductor device, it is necessary to reduce the distance between the laminated semiconductor chips. However, in this case, inadequate insulation may occur since the distance between the bonding wires and semiconductor chips come close enough to contact each other.

This being the case, forming the insulation layer between the bonding wires and the semiconductor chip to which the bonding wires are connected prevents contact between the bonding wires and laminated semiconductor chips adjacent thereto. Namely, forming the insulation layer between electrode terminals of the semiconductor chip having bonding wires connected to the electrode terminals and the semiconductor chip which is adjacent to the semiconductor chip prevents contact between the bonding wires and the semiconductor chip which is adjacent to the semiconductor chip to which the bonding wires are connected.

Consequently, it becomes possible to ensure insulation of the semiconductor device having a plurality of laminated semiconductor chips. For example, even in the case of downsizing the semiconductor device by reducing the distance between the laminated semiconductor chips, the insulation layer prevents contact between the bonding wires and semiconductor chips, thereby ensuring insulation of the semiconductor device.

As described, in the semiconductor device having a plurality of semiconductor chips laminated on the substrate, it is possible to prevent inadequate insulation between the bonding wires and semiconductor chips. In other words, it is possible to ensure insulation of the semiconductor device since the insulation layer formed between the bonding wires and semiconductor chips prevents contact between the bonding wires and the semiconductor chips.

Consequently, ensuring insulation of the semiconductor device having a plurality of semiconductor chips laminated on the substrate makes it possible to provide a semiconductor device having high reliability and ensured insulation even in the case where the outer dimensions of the device are reduced.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 18 is a cross-sectional view showing the case of downsizing a conventional semiconductor device which has an adhesion layer intervening between each of the laminated semiconductor chips.

DESCRIPTION OF THE EMBODIMENTS

The following will explain one embodiment of the present invention with reference to FIGS. 1 through 12. Note that, the present invention is not limited by the following embodiments in any ways.

FIGS. 1 through 4 are explanatory views showing structures of semiconductor devices according to the present embodiment.

Figure 1:
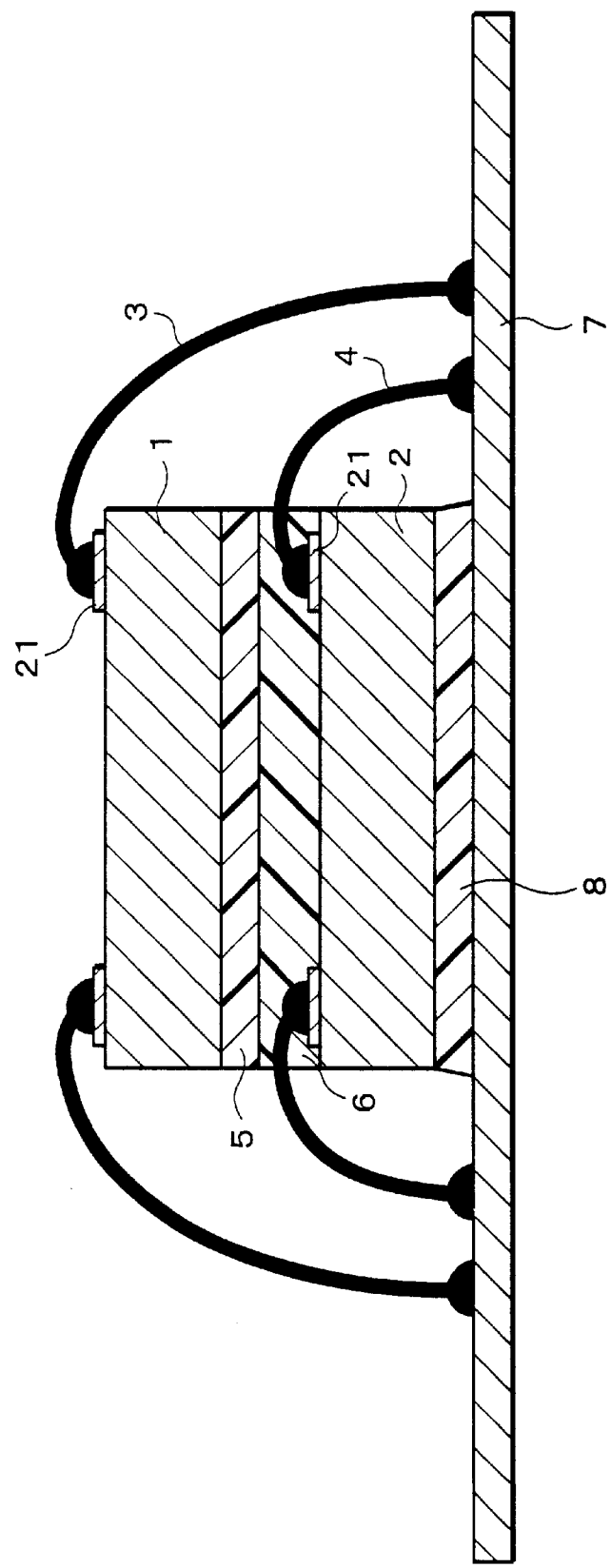
FIG. 1 is a cross-sectional view of a semiconductor device according to one embodiment of the present invention.

FIG. 1 shows a semiconductor device in which two semiconductor chips are laminated. As shown in FIG. 1, the semiconductor device of the present embodiment is made up of a first semiconductor chip 1, a second semiconductor chip 2, a first bonding wire 3, a second bonding wire 4, an insulation layer 5, an adhesion layer 6, a substrate 7, an adhesive layer 8 and electrode terminals 21. Note that, in the present embodiment, semiconductor chips which are laminated on the substrate 7 will be referred as simply "semiconductor chips" unless otherwise specified.

The second semiconductor chip 2 which makes up the semiconductor device according to the present embodiment is adhered to the substrate 7 via the adhesive layer 8. The first semiconductor chip 1 is adhered on the side of the second semiconductor chip 2 opposite the substrate 7 by the adhesion layer 6 via the insulation layer 5. The first bonding wire 3 electrically connects electrode terminal 21 of the first semiconductor chip 1 to the substrate 7. The second bonding wire 4 electrically connects the electrode terminal 21 of the second semiconductor chip 2 to the substrate 7. Note that, the electrode terminals 21 are provided on the side of the first semiconductor chip 1 and the second semiconductor chip 2 opposite the substrate 7.

The type of a semiconductor chip which makes up the semiconductor device of the present embodiment is not particularly limited and of any type. Suitable example of the plurality of semiconductor chips include those having the same outer shape, or those having the electrode terminals at the same position so that the positions of electrode terminals overlap when they are laminated.

The semiconductor devices shown in FIGS. 1 through 4 has a structure in which semiconductor chips having the same outer shape are laminated.

Figure 2:
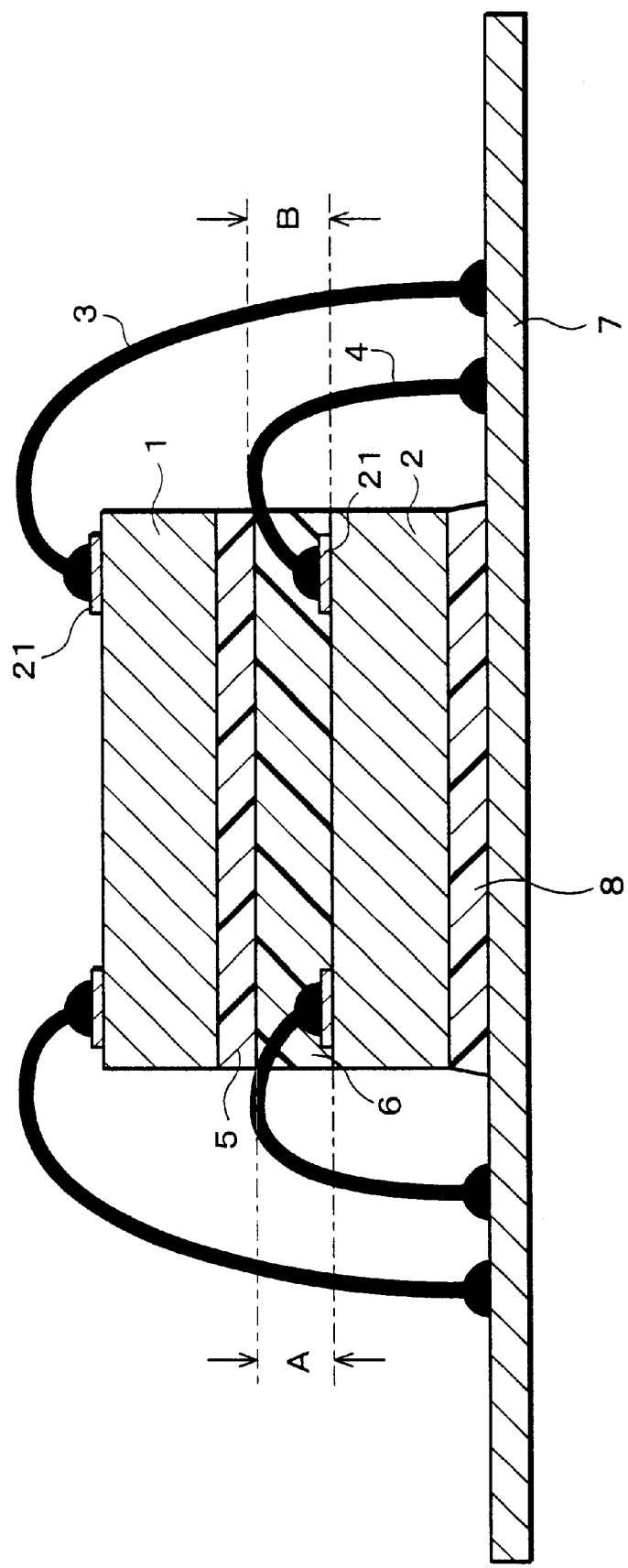
FIG. 2 is a cross-sectional view of a semiconductor device according to another embodiment of the present invention having a structure in which bonding wires are connected by a forward wire bonding method.

FIG. 2 shows a semiconductor device having a structure in which the thickness of the adhesion layer 6 is not greater than height B of the second bonding wire 4 from the surface of the second semiconductor chip 2 where the electrode terminals 21 are provided. As shown in the figure, the semiconductor device according to the present embodiment is capable of preventing contact between the first semiconductor chip 1 and the second bonding wire 4 by the insulation layer 5 intervening between the first semiconductor chip 1 and the second bonding wire 4. Namely, the insulation layer 5 ensures insulation of the semiconductor device.

Figure 3:
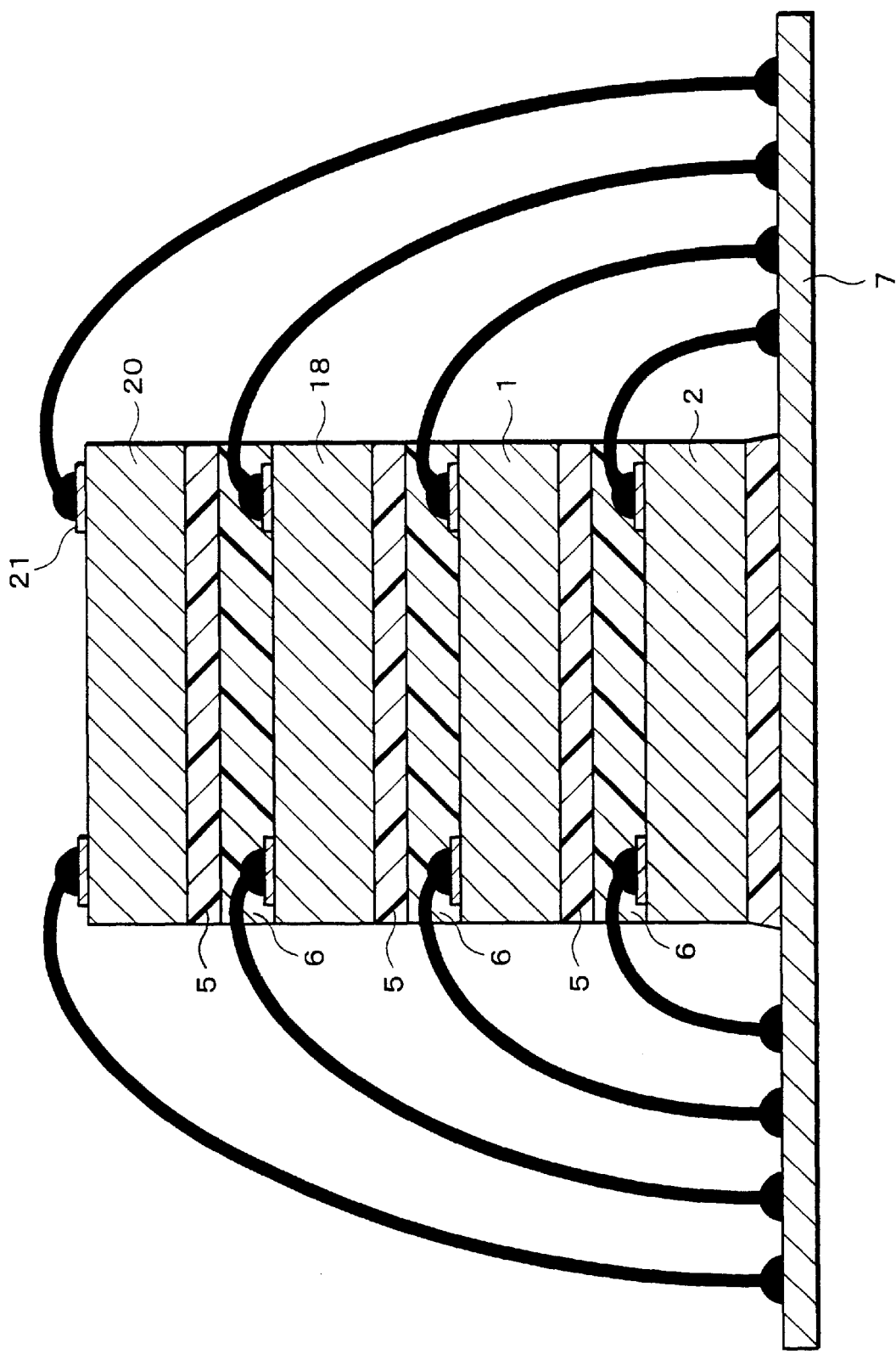
FIG. 3 is a cross-sectional view of a semiconductor device according to a still another embodiment of the present invention in which four semiconductor chips are laminated thereon.

FIG. 3 shows a semiconductor device which is equipped with four laminated semiconductor chips. As shown in FIG. 3, a second semiconductor chip 2, a first semiconductor chip 1, a third semiconductor chip 18 and a fourth semiconductor chip 20 are laminated in this order from the side of the substrate 7 in the semiconductor device, and the insulation layer 5 and the adhesion layer 6 are provided intervening between these semiconductor chips. As described, even though a number of semiconductor chips are laminated, the insulation layer 5 prevents contact between the bonding wires and the semiconductor chip while the adhesion layer 6 adheres each of semiconductor chips, since the insulation layer 5 and the adhesion layer 6 intervene between the semiconductor chips.

In order to downsize a semiconductor device having laminated semiconductor chips, it is effective to reduce the thickness of the adhesion layer 6 which adheres the semiconductor chips each other. However, in absence of the insulation layer 5 between the semiconductor chips, the bonding wires and semiconductor chips come close enough to contact each other as the thickness of the adhesion layer 6 is reduced. Therefore, insulation of the semiconductor device may not be ensured in the case.

However, the semiconductor device according to the present embodiment is capable of preventing contact between bonding wires and semiconductor chips by the insulation layer 5 intervening between the semiconductor chips, thereby ensuring insulation of the semiconductor device even when the thickness of the adhesion layer 6 is reduced.

Namely, it becomes possible to downsize the semiconductor deice having a plurality of laminated semiconductor chips while ensuring insulation of the device. Note that, the semiconductor device shown in FIG. 3 has four laminated semiconductor chips; however, the number of laminated semiconductor chips is not just limited to four but any number of semiconductor chips can be used.

Figure 4:
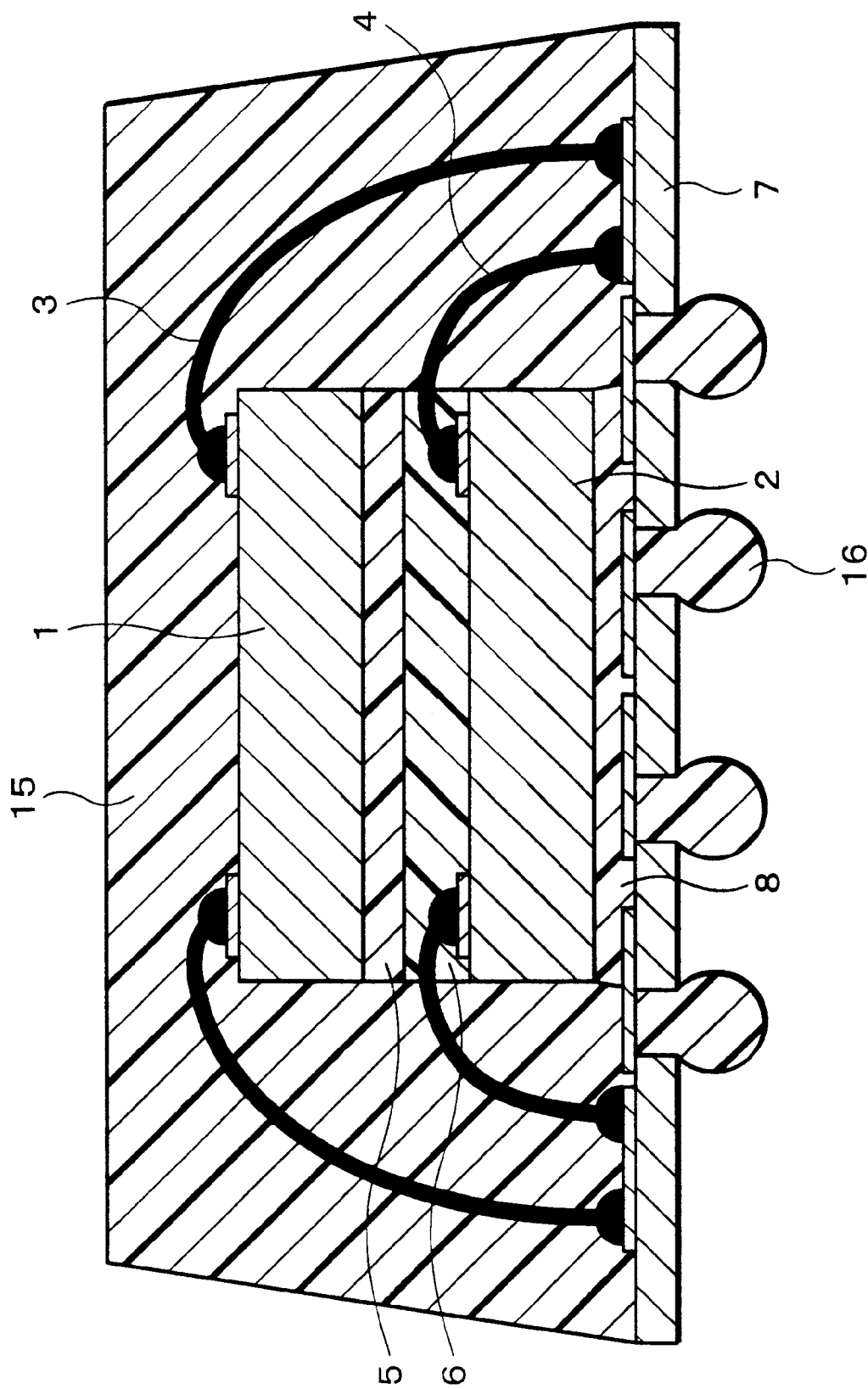
FIG. 4 is a cross-sectional view of a semiconductor device produced by sealing with a sealing resin according to a further embodiment of the present invention.

FIG. 4 shows a semiconductor device which is sealed by a sealing resin (Chips Size Package, hereinafter abbreviated as CSP). As shown in FIG. 4, the semiconductor device according the present embodiment is sealed by a sealing resin 15, and has an external connection terminal (external terminal) 16 on the side of the substrate 7 opposite the semiconductor chips. The external connection terminal 16 provides the external electrical connection for the substrate 7. As the sealing resin 15, a thermosetting resin may be used. To be more specific, an epoxy resin, a silicon resin or the like may be suitably used.

A manufacturing method according to the present invention will be explained with reference to FIGS. 5 through 7.

First of all, the following will explain a method of forming an insulation layer and an adhesion layer on the rear side of a semiconductor chip. Note that, in the present embodiment, the side of the semiconductor chip where having electrode terminals are formed will be called the front surface, and the side without electrode terminals will be called the rear surface.

Formation of the insulation layer and the adhesion layer are performed on a wafer before the wafer is manufactured into semiconductor chips by being provided with various elements. Note that, the rear surface may be polished in the state of a wafer. This polishing of the rear surface makes it possible to reduce the thickness of the wafer before forming the insulation layer and the adhesion layer, thereby further downsizing the semiconductor chip.

Figure 5:
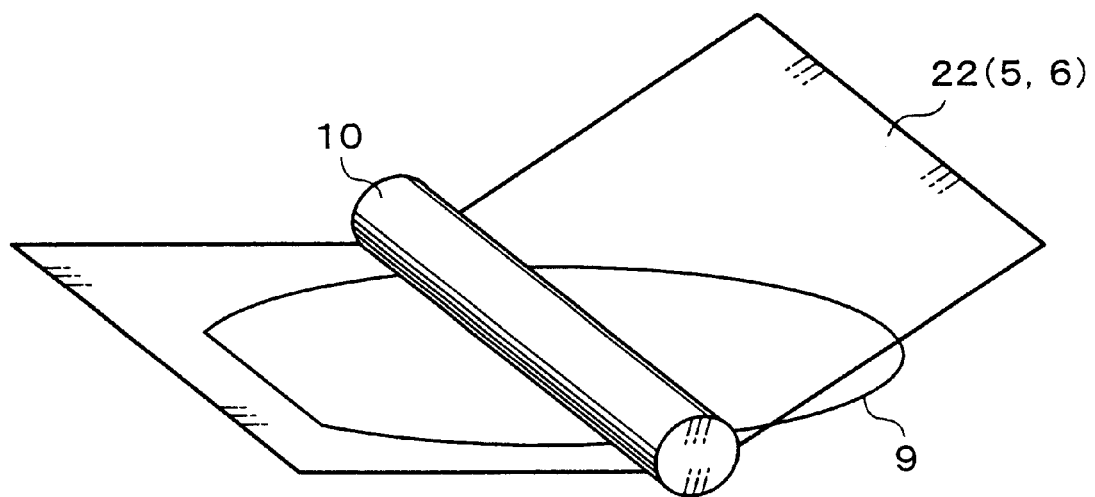
FIG. 5 is a perspective view showing a sheet affixing process according to a manufacturing method of the present invention.

As a method of forming the insulation layer and the adhesion layer on the rear surface of the semiconductor wafer, as shown in FIG. 5, a sheet 22 of a bi-layer structure made up of the insulation layer 5 and the adhesion layer 6 may be affixed to the rear surface of a wafer 9 using an affixing roller 10. Note that, the sheet 22 is affixed to the rear side of the wafer 9 on the insulation layer 5.

In the figure, the sheet 22 which is made up of the insulation layer 5 and the adhesion layer 6 is used; however, the insulation layer 5 and the adhesion layer 6 which are in a state of separate sheets, may also be respectively affixed. More specifically, formation of the insulation layer 5 and the adhesion layer 6 on the rear surface of the wafer may be performed by affixing a sheet of the insulation layer 5 to the rear surface of the wafer, and thereafter affixing a sheet of the adhesion layer 6 thereon.

It is desirable that the insulation layer 5 and the adhesion layer 6 are made of material in the form of a sheet of a uniform thickness. In this way, it is possible to easily form the insulation layer 5 and the adhesion layer 6 of a uniform thickness.

As the insulation layer 5, a resin having superior heat-resistance which can suppress plastic deformation at a temperature of 100° C.–200° C. is preferably used. More specifically, it is preferable that the insulation layer 5 is made of resin containing polyimido.

When a resin which easily undergoes plastic deformation at high temperatures is used, insulation of the semiconductor device may not be ensured due to plastic deformation of the insulation layer 5 which may occur under high temperature conditions. On the other hand, using a resin having superior heat-resistance prevents deformation of the insulation layer 5 under high temperature conditions, thereby ensuring insulation of the semiconductor device under high temperature conditions.

The thickness of the insulation layer 5 is not particularly limited as long as it can ensure insulation and can be affixed to the rear surface of the wafer. However, considering, for example, downsizing of the semiconductor device (package) having a plurality of laminated semiconductor chips, it is preferable that the thickness is not less than 15 μm but not more than 30 μm. By defining the thickness of the insulation layer 5 within the range above, it is possible to downsize the semiconductor device while ensuring insulation.

Further, as the adhesion layer 6, a thermosetting resin which melts from a solid body into liquid and thereafter cures by heating is preferred. Among such a thermosetting resin, an epoxy resin is most preferable. Besides the function of connecting the semiconductor chips to each other, the adhesion layer 6 is used for sealing/protecting the second bonding wire 4 which is connected to the electrode terminal 21 of the second semiconductor chip 2.

Accordingly, it is preferable that the thickness A (FIG. 7) of the adhesion layer 6 is at or greater than the height B (FIG. 7) of the second bonding wire from the second semiconductor chip 2.

Figure 6:
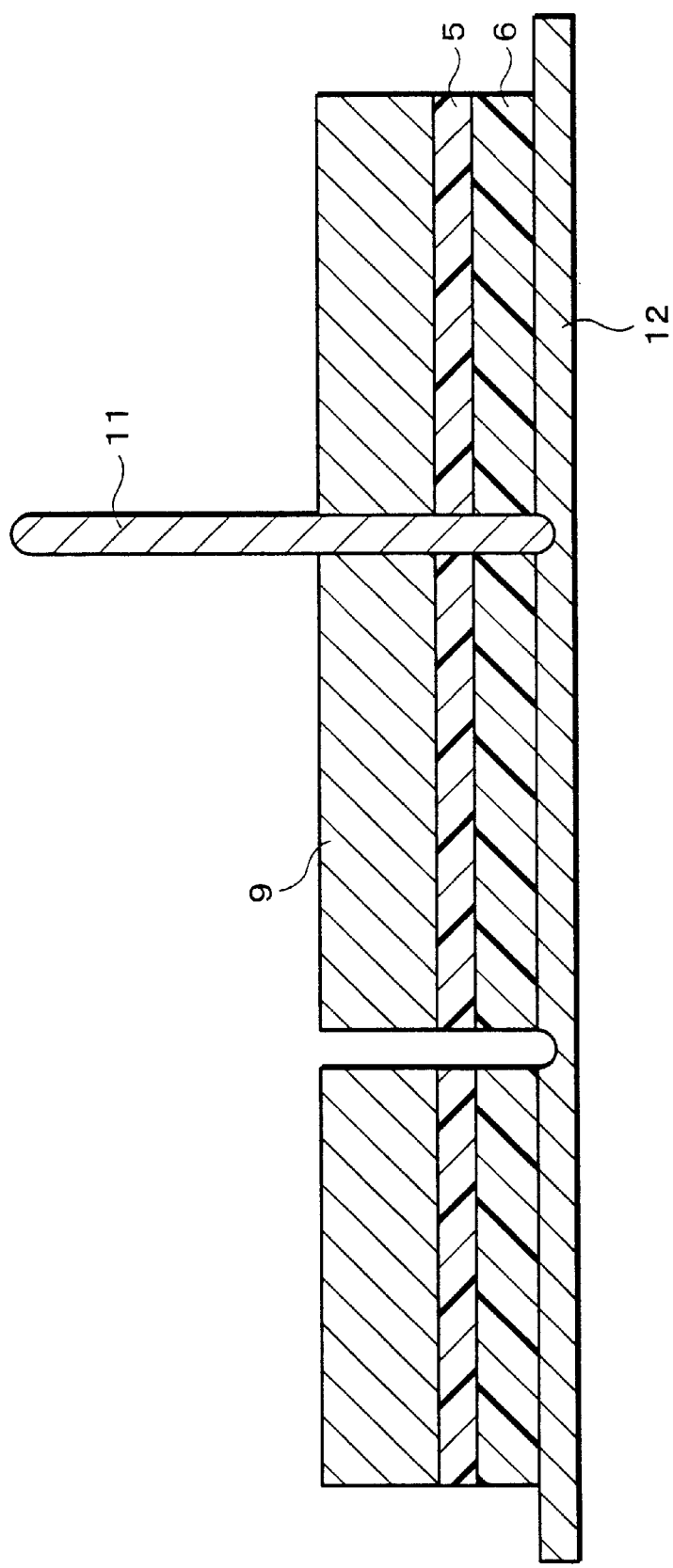
FIG. 6 is a cross-sectional view showing a dividing process according to the manufacturing method of the present invention.

Referring to FIG. 6, the following will explain a method of cutting the wafer 9 into individual pieces of semiconductor chips by a dicing blade 11 after the insulation layer 5 and the adhesion layer 6 are formed on the rear surface of the wafer 9. As shown in the figure, the wafer 9 having the insulation layer 5 and the adhesion layer 6 formed thereon in placed on a cutting sheet 12, and is cut into semiconductor chips using a dicing blade 11. This makes possible to cut the insulation layer 5, the adhesion layer 6 and the wafer 9 at once to create individual semiconductor chips. Namely, by simultaneously cutting the insulation layer 5 and the adhesion layer 6 with the wafer 9 using the dicing blade 11, it is possible to create semiconductor chips with the insulation layer 5 and the adhesion layer 6 are formed having the same size as the semiconductor chip.

By creating the semiconductor chips with the foregoing method makes it easier to control the adhesion area, adhesive volume, and the thickness of the adhesion layer formed on the semiconductor chips in comparison with a method of forming the adhesion layer by coating an adhesive.

Figure 7:
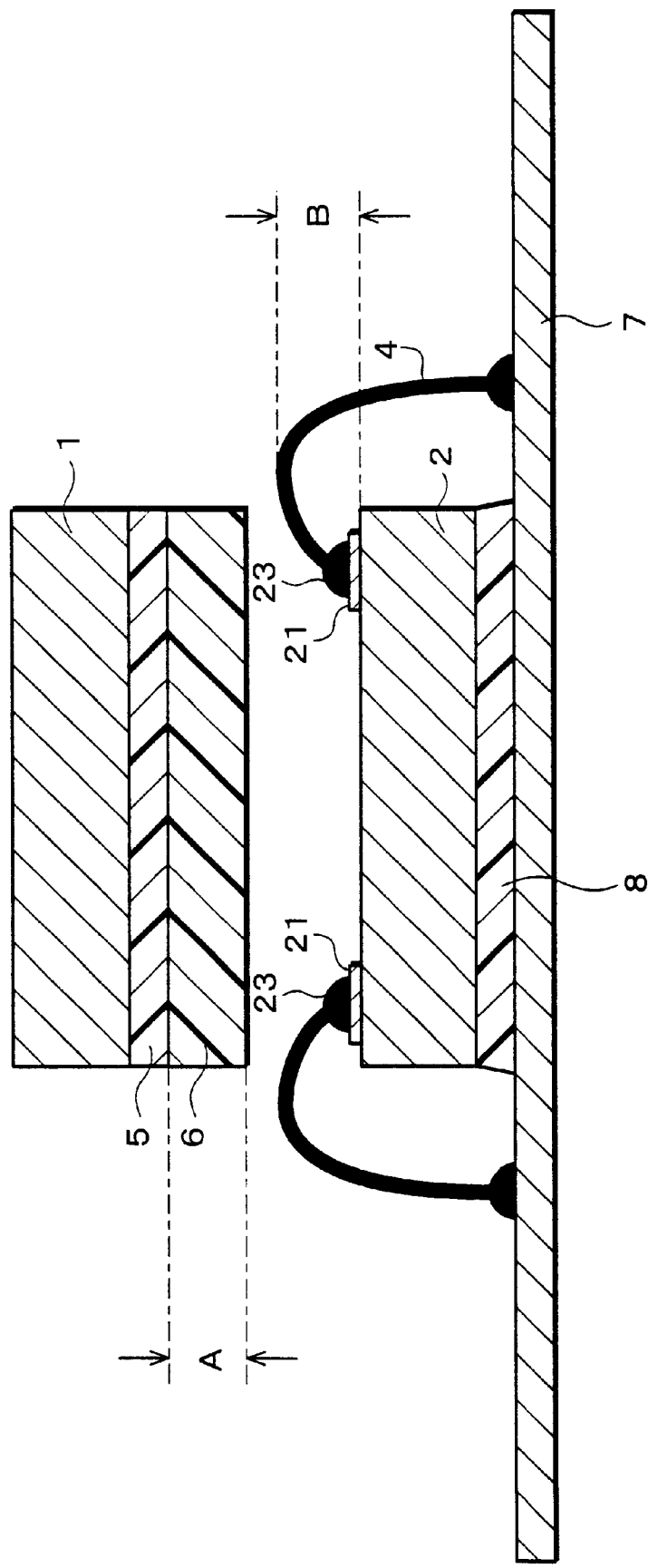
FIG. 7 is a cross-sectional view showing an adhering process according to the manufacturing method of the present invention.

Referring to FIG. 7, the following will explain a method of laminating the semiconductor chips which are obtained through the foregoing process on a substrate, i.e., a method of creating a package. As shown in the figure, firstly, the second semiconductor chip 2 is mounted on the substrate 7 by using an adhesive. More specifically, the second semiconductor chip 2 is mounted on the substrate 7 via the adhesive layer 8 which is made of an adhesive.

As the substrate 7, a leadframe having a wire bonding terminal, or an organic substrate made of polyimido resin, bismaleimido triazine resin or the like may be used. However, the substrate is not limited to these and any kinds of substrates may be used. As the adhesive which makes up the adhesive layer 8, for example, a liquid adhesive or a sheet adhesive can be used. Further, the adhesive may be any kind as long as it can evenly adhere the whole part of the first semiconductor chip 1 to the substrate 7.

Then, a wire bonding terminal of the substrate 7 is electrically connected to the electrode terminal 21 of the second semiconductor chip 2 by the second bonding wire 4 after mounting the second semiconductor chip 2 on the substrate 7.

Thereafter, the first semiconductor chip 1 is adhered to the second semiconductor chip 2 which was mounted on the substrate 7. The first semiconductor chip 1 is adhered so that the adhesion layer 6 covers a portion of the semiconductor chip 2 where the electrode terminal 21 is connected to the second bonding wire 4.

When adhering the first semiconductor chip 1, it is preferable that the substrate 7, the second semiconductor chip 2 and the second bonding wire 4 are heated to a temperature which softens/melts the epoxy resin which makes up the adhesion layer 6 formed on the rear surface of the first semiconductor chip 1. For example, in the case where the temperature which starts softening/melting of the epoxy resin is 100° C., the substrate 7, the second semiconductor chip 2 and the second bonding wire 4 are heated to 100° C. This makes it possible to adhere the first semiconductor chip 1 and the second semiconductor chip 2 without damaging the second bonding wire 4, since the adhesion layer 6 which is formed on the rear surface of the first semiconductor chip 1 is softened when adhering the first semiconductor chip 1 to the second semiconductor chip 2.

Thereafter, a wire bonding terminal of the substrate 7 and the electrode terminal 21 of the first semiconductor chip 1 are electrically connected by using the first bonding wire 3 (see FIG. 1) after completely curing the thermosetting resin which makes up the adhesion layer 6.

Figure 8:
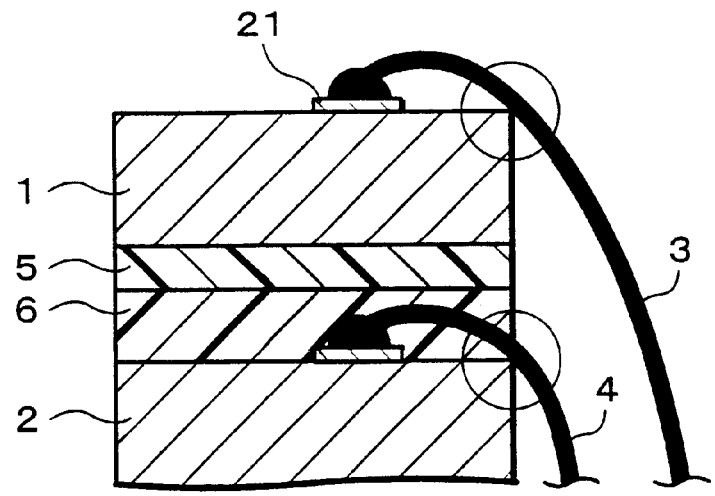
FIG. 8 is a cross-sectional view of a semiconductor device according to a sill further embodiment of the present invention.
Figure 9:
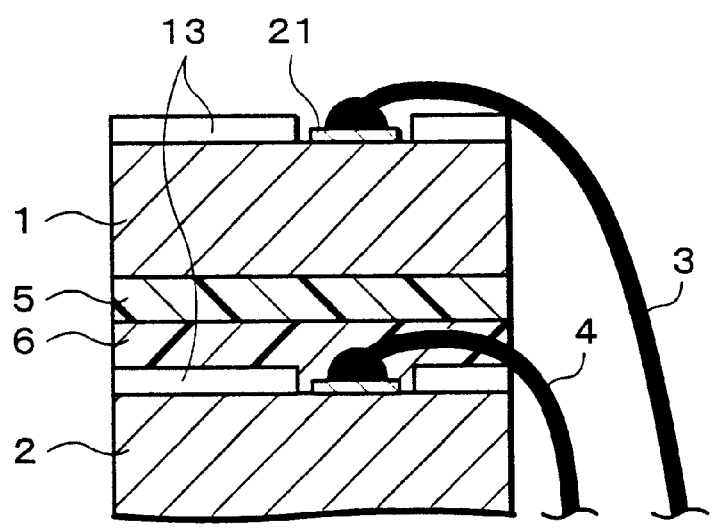
FIG. 9 is a cross-sectional view of a semiconductor device according to a sill further embodiment of the present invention which has a structure in which an insulation resin layer is formed on a side of a semiconductor chip having electrode terminals, except the part where the electrode terminals are provided.

It may be considered possible that the first bonding wire 3 and the second bonding wire 4 respectively contact the periphery of the first semiconductor chip 1 and the second semiconductor chip 2 as shown in FIG. 8. Therefore, as shown in FIG. 9, it is preferable that a coating resin (an insulation resin layer) 13 is formed on the side of the first semiconductor chip 1 and the second semiconductor chip 2 where the electrode terminals 21 are formed. The coating resin 13 is used for preventing contact between the semiconductor chips and bonding wires, and an insulation resin, for example, polyimido can be adopted for the coating resin 13.

After thus laminating the semiconductor chips on the substrate, the sealing resin 15 and the external connection terminals 16 (solder balls) are formed as shown in FIG. 4, to obtain a CSP.

In the case of laminating the semiconductor chips on the substrate, the semiconductor chips and bonding wires may be sealed by potting using a liquid resin.

Carrying out the reverse wire bonding method after forming a bump on the electrode terminal 21 as the method (wire bonding method) of connection between the electrode terminal 21 provided on the second semiconductor chip 2 and the second bonding wire 4 is effective for downsizing the semiconductor device. Since the method makes it possible to reduce the thickness A of the adhesion layer 6 (see FIG. 7), it is especially effective for downsizing the semiconductor device produced by laminating a number of semiconductor chips.

As described, it is preferable that the thickness A of the adhesion layer 6 is at or greater than the height B (FIG. 7) of the second bonding wire 4 from the second semiconductor chip 2. The required height of the bump to make the connection through the reverse wire bonding method can be made shorter than the height B (see FIG. 7) of the second bonding wire 4 from the second semiconductor chip 2 provided with the electrode terminals 21 resulting from the forward wire bonding method. Consequently, by carrying out the reverse wire bonding method after forming the bump 23 on the electrode terminal 21, it is possible to reduce thickness of the adhesion layer 6.

For example, forming a bump which has the height of 40 $\mu$m, and assuming that the insulation layer 5 and the adhesion layer 6 of the first semiconductor chip 1 have the thickness of 25 $\mu$m and the thickness of 50 $\mu$m respectively, then the thickness of the part of the laminated chips where the insulation layer 5 and the adhesion layer 6 are present becomes 75 $\mu$m. On the other hand, in the case of adopting the forward wire bonding method, it is difficult to reduce the height of the bonding wire from the semiconductor chip. Therefore, the thickness of the part of the laminated chips becomes about 130 $\mu$m–160 $\mu$m in this case.

Namely, adopting the reverse wire bonding method as the method of connecting the electrode terminal 21 and the second bonding wire 4 is advantageous in terms of increasing the number of laminated semiconductor chips and downsizing the semiconductor device, because the method can reduce the thickness of the part of the laminated chips. As a result, it is possible to realize lamination of semiconductor chips which is thinner than the conventional one and having high reliability and ensured insulation.

Note that, the reverse wire bonding method is a method in which the bonding wire is connected to the substrate after the semiconductor chip is connected to the bonding wire. The forward wire bonding method is a method in which the order of connection is reversed.

In the case of carrying out the reverse wire bonding method, first gold bumps are formed on electrode terminals provided on the semiconductor chip, and then the bonding wires are connected to the substrate, and thereafter the bonding wires are connected to the gold bumps.

Figure 10:
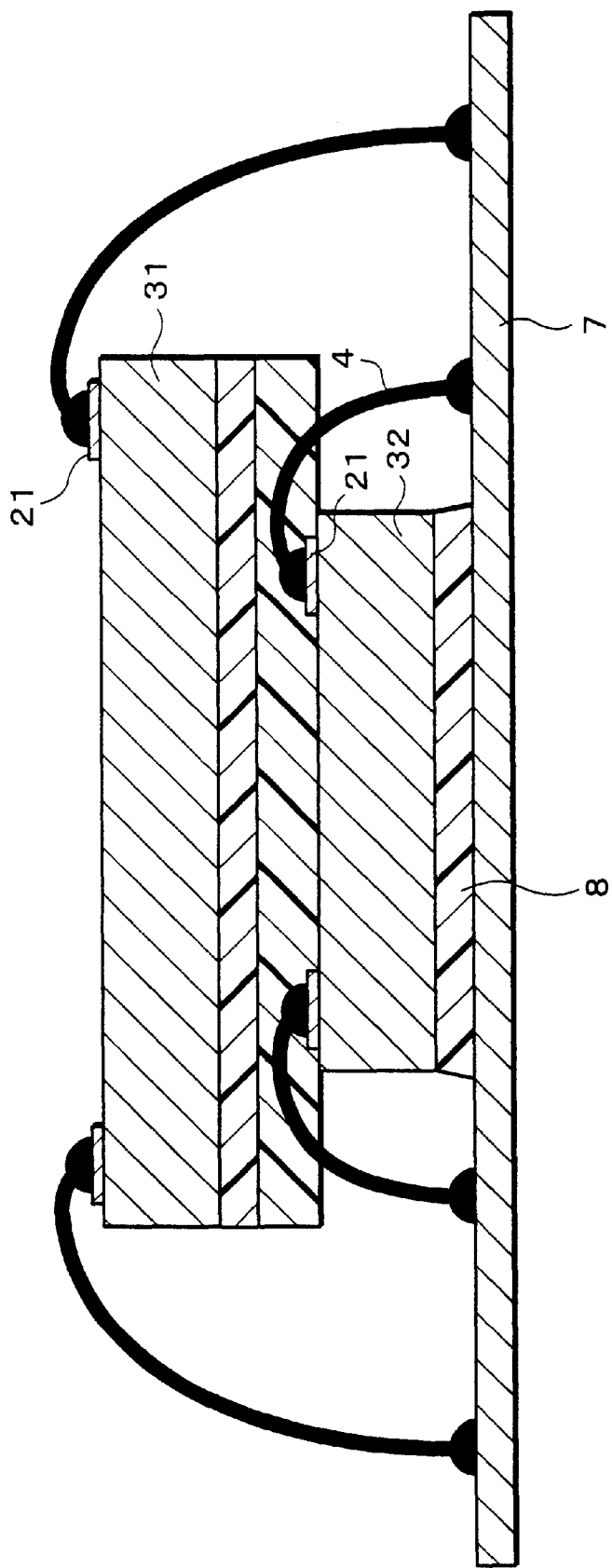
FIG. 10 is a cross-sectional view showing an example of a combination of semiconductor chips which make up a semiconductor device according to the present invention.

Since the semiconductor device according to the present embodiment has ensured insulation between the semiconductor chips and bonding wires by the insulation layer, the chip size of the laminating semiconductor chips is not restricted. Accordingly, as shown in FIG. 10, it is possible to laminate a fifth semiconductor chip 31 which is larger than a sixth semiconductor chip 32 on the side of the sixth semiconductor chip 32 opposite the substrate 7.

Figure 11:
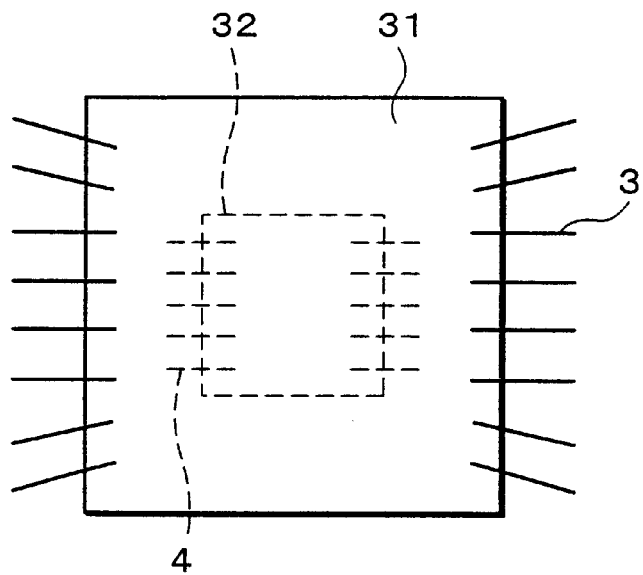
FIG. 11 is a plan view showing an example of a combination of semiconductor chips which make up a semiconductor device according to the present invention.
Figure 12:
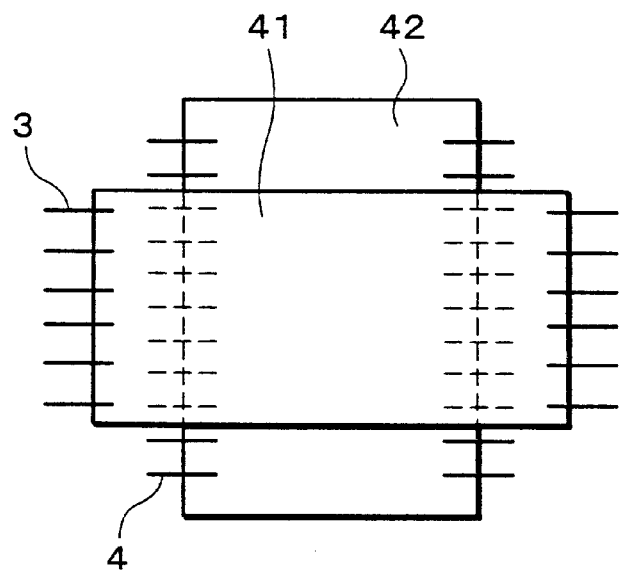
FIG. 12 is a plan view showing another example of a combination of semiconductor chips which make up a semiconductor device according to the present invention.
Figure 13:
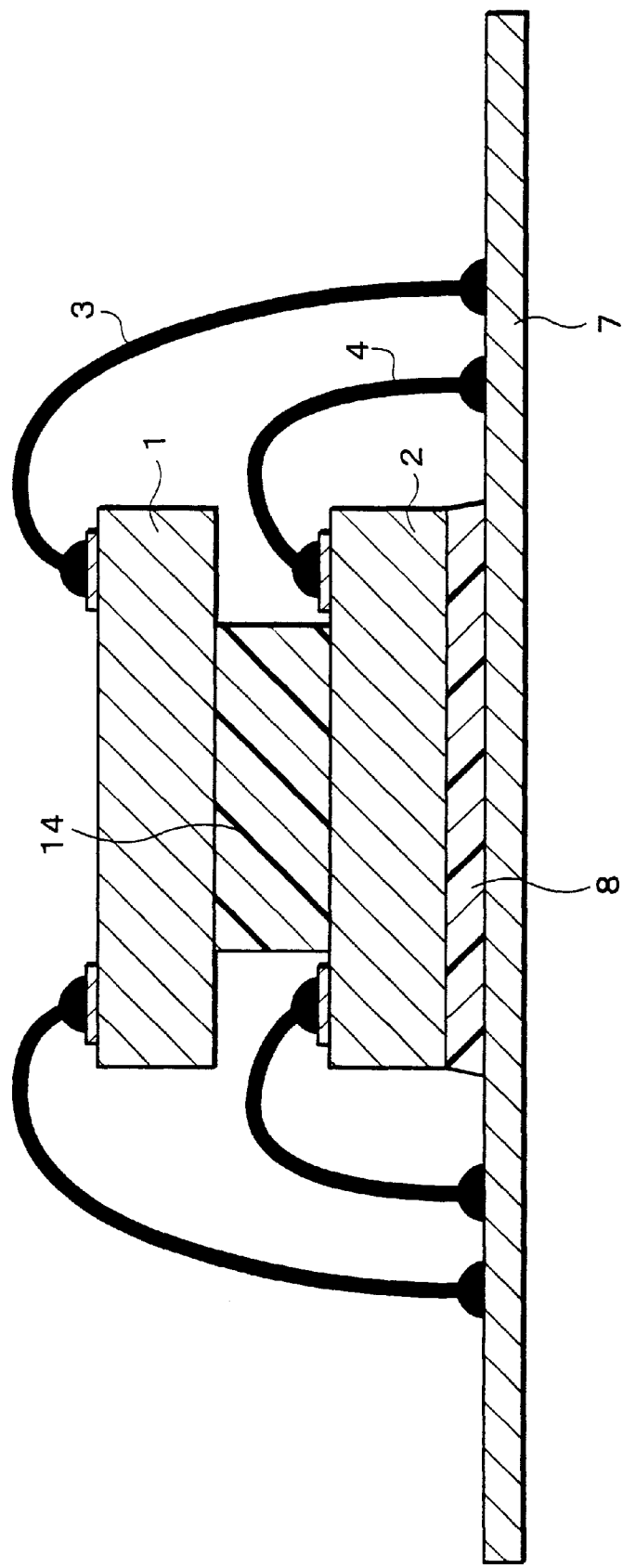
FIG. 13 is a cross-sectional view showing a conventional semiconductor device having a structure in which a spacer is sealed between laminated semiconductor chips.
Figure 14:
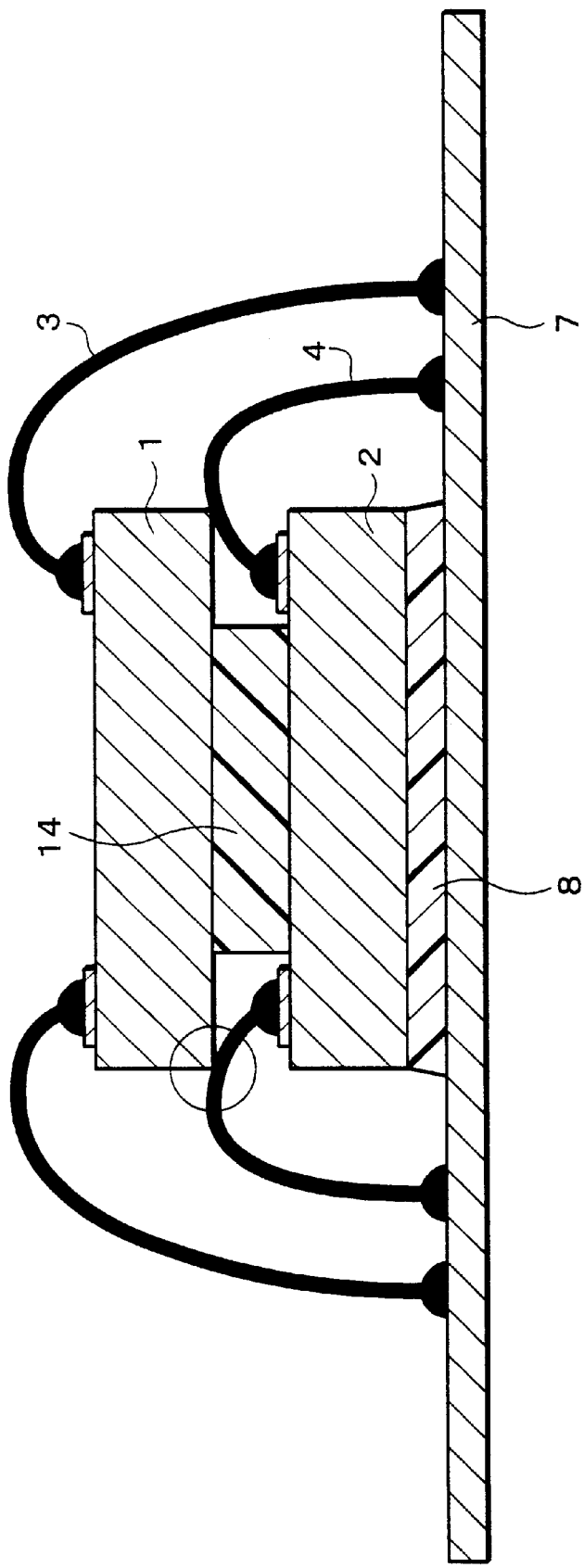
FIG. 14 is a cross-sectional view showing the case of downsizing a conventional semiconductor device having a structure in which a spacer is sealed between the laminated semiconductor chips.
Figure 15:
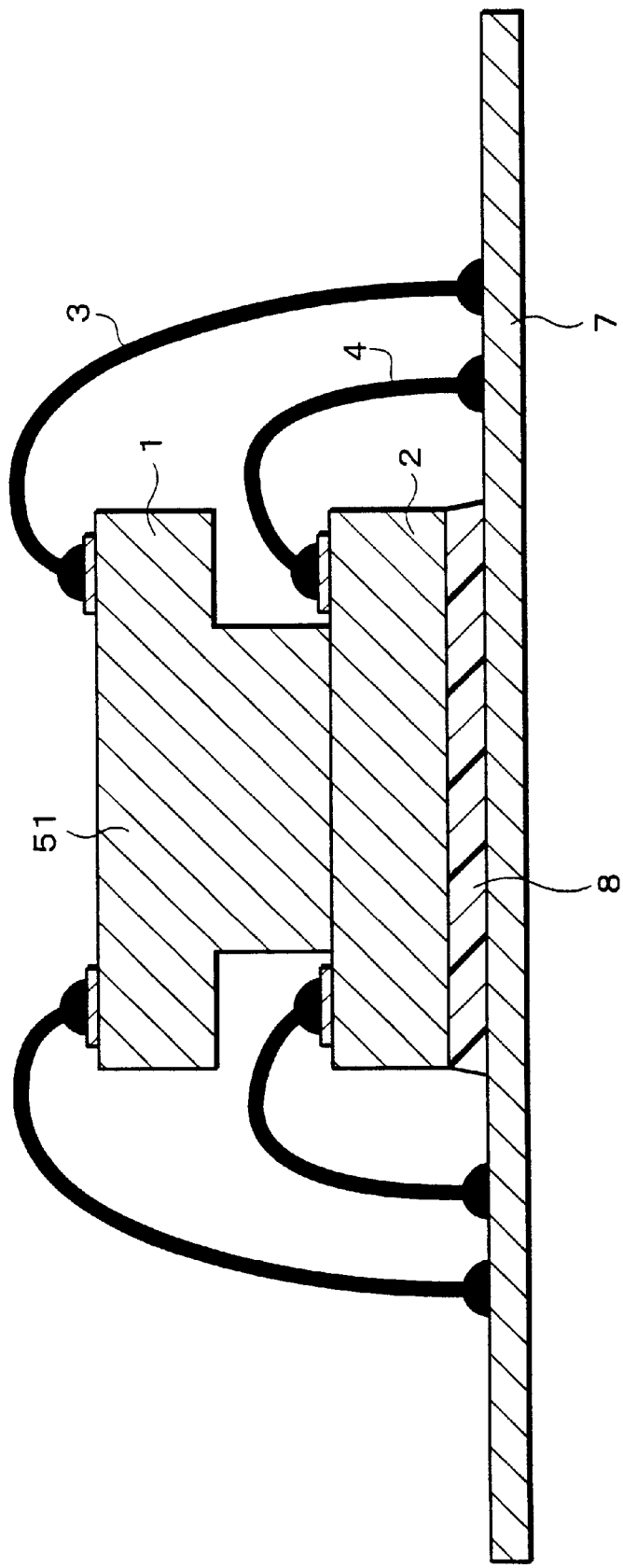
FIG. 15 is a cross-sectional view showing a semiconductor device having an irregular structure in which the periphery is thinner than the center.
Figure 16:
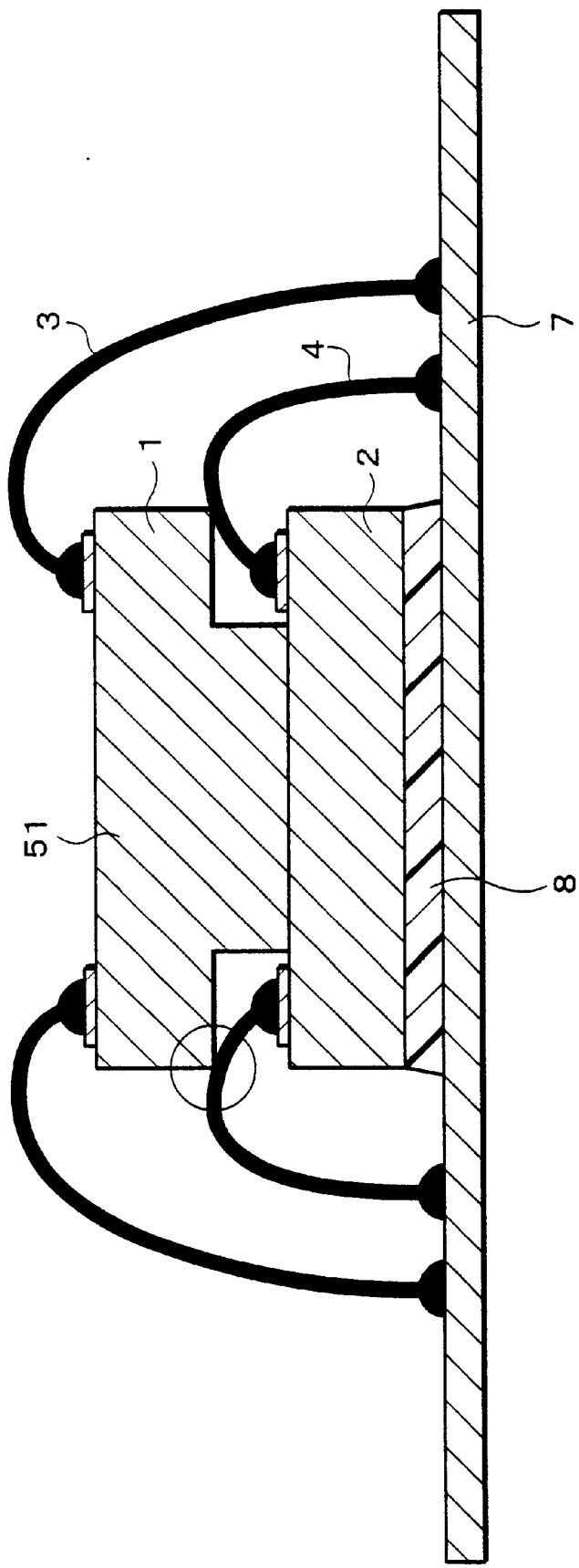
FIG. 16 is a cross-sectional view showing the case of downsizing a conventional semiconductor device having an irregular structure in which the periphery is thinner than the center.
Figure 17:
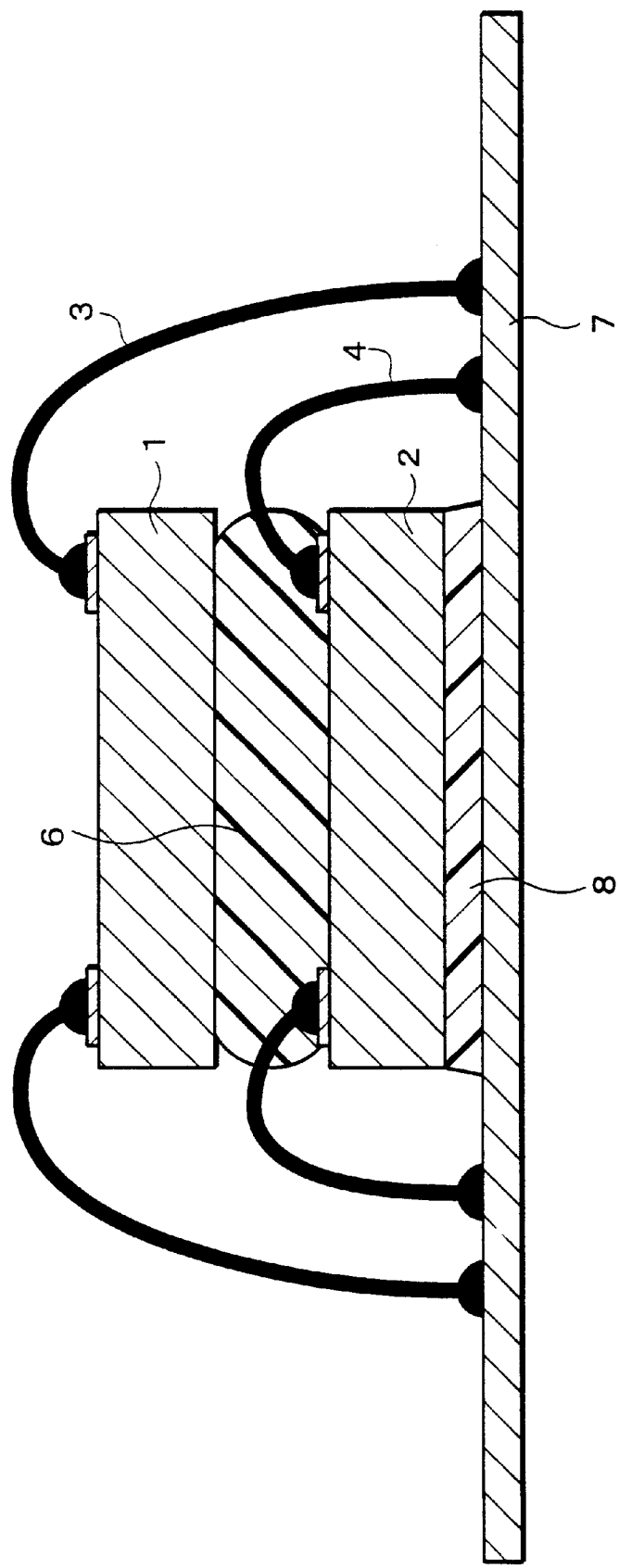
FIG. 17 is a cross-sectional view showing a semiconductor device which has an adhesion layer intervening between each of the laminated semiconductor chips.

In the semiconductor device according to the present embodiment, since it is possible to laminate the semiconductor chips on a part of the semiconductor chip where the bonding wires are connected to the electrode terminals, the laminated semiconductor chips may be arranged in the configuration (layout) shown in FIG. 11 or FIG. 12 for example. This arrangement is more advantageous than the arrangement where the sixth semiconductor chip 32 is laminated on the fifth semiconductor chip 31 because it can reduce the length of the second bonding wire 4 which connects the sixth semiconductor chip 32 and the substrate 7 (see FIG. 10).

More specifically, as shown in FIG. 11, by adhering the fifth semiconductor chip 31, which is larger than the sixth semiconductor chip 32, to the sixth semiconductor chip 32 which is mounted on the substrate 7 (FIG. 10) so that the second bonding wire 4 is placed between the fifth semiconductor chip 31 and the substrate 7, it becomes possible to effectively use the spacing between the fifth semiconductor chip 31 and the substrate 7, thereby further downsizing the semiconductor device.

Further, as shown in FIG. 12, by adhering a seventh semiconductor chip 41, which has a different chip size from an eighth semiconductor chip 42, to the eighth semiconductor chip 42 which is mounted on the substrate 7 so that a part of the second bonding wire 4 is placed between the seventh semiconductor chip 41 and the substrate 7, it becomes possible to effectively use the spacing between the seventh semiconductor chip 41 and the substrate 7, thereby downsizing the semiconductor device.

As described, the semiconductor device according to the present embodiment is capable of laminating for example, a plurality of the semiconductor chips having the same chip size, without restricting the chip size of the laminated semiconductor chips. This makes it possible to provide a thinner and more reliable semiconductor device of a laminated structure.

The semiconductor device of the present invention may be provided as a first semiconductor device having a structure in which a plurality of the semiconductor chips with a plurality of electrode terminals on their respective main surfaces are laminated on the substrate, and the electrode terminals and the bonding wires are electrically connected to each other, wherein between the semiconductor chip of an arbitrary upper layer and the semiconductor chip of an arbitrary lower layer are provided on adhesion layer made of resin and an insulation layer made of resin from the bottom, and the upper semiconductor chip is adhered on at least a part of the electrode terminals of the lower semiconductor chip which are connected by the bonding wires.

The first semiconductor device may have an arrangement in which bumps are formed on the electrode terminals of the lower semiconductor chip, and the bonding wires which connect the lower semiconductor chip and the substrate are wires which are connected through the reverse wire bonding method.

The first semiconductor device may have an arrangement in which the semiconductor chip connected to one side of the substrate, and the bonding wires are sealed by a resin, and external connection terminals are formed on the other side of the substrate.

The first semiconductor device may have an arrangement in which the insulation layer is made of polyimido-containing resin and the adhesion layer is made of epoxy-containing resin.

The first semiconductor device may have an arrangement in which the thickness of the insulation layer is in a range of from not less than 15 μm and not more than 30 μm.

The first semiconductor device may have an arrangement in which the main surface of the lower semiconductor chip, particularly from the electrode terminals to the edge of the chip, is covered with an insulation resin.

The first semiconductor device may have a arrangement in which the electrode terminals which are disposed on the lower semiconductor chip are covered with an insulation resin having an opening.

The manufacturing method of the semiconductor device according to the present invention may have the steps of: affixing a sheet made up of an insulation resin layer and an adhesion resin layer to the rear surface of a wafer on the insulation resin layer before the wafer is divided into semiconductor chips, and then dividing the wafer into semiconductor chips by dicing, and adhering the divided semiconductor chips to the semiconductor chip which is electrically connected to the substrate by bonding wires.

The manufacturing method of the semiconductor device according to the present invention may have the steps of: affixing a sheet of the insulation resin layer, followed by a sheet of the adhesion resin layer, to the rear surface of a wafer, and thereafter dividing the wafer into semiconductor chips by dicing, and then adhering the divided semiconductor chips to the semiconductor chip which is electrically connected to the substrate by bonding wires.

It is preferable in the semiconductor device according to the present invention that the insulation layer is made of polyimido-containing resin.

It is preferable that the material of the polyimido-containing resin has superior heat-resistance which can suppress plastic deformation at a high temperature. By thus selecting a material which has superior heat-resistance as the polyimido-containing resin, it becomes possible to form the insulation layer which hardly undergo plastic deformation at high temperature. Therefore, forming the insulation layer by using a polyimido resin further ensures insulation of the semiconductor device under high temperature conditions.

In the semiconductor device according to the present invention, it is preferable that the thickness of the insulation layer is in a range of from not less than 15 μm and not more than 30 μm.

By thus restricting the thickness of the insulation layer within this range, it is possible to downsize the semiconductor device which is produced by laminating the semiconductor chips, while ensuring insulation.

It is preferable that the electrode terminals of the semiconductor device according to the present invention respectively have bumps, and the bonding wires are connected through the reverse wire bonding method.

With the foregoing arrangement, it is possible to reduce the distance between the laminated semiconductor chips. Namely, forming bumps on the electrode terminals makes it possible to adopt the reverse wire bonding method as a method of connecting the electrode terminals and the substrate, thereby reducing the distance between individual semiconductor chips.

More specifically, the height of the bumps can be made shorter than that of the bonding wires from the surface of semiconductor chip to which the bonding wires are connected via the electrode terminals by the forward wire bonding method. Further, with the reverse wire bonding method, the bonding wires can be connected more securely.

Accordingly, reducing the distance between the laminated the semiconductor chips makes it easier to downsize the semiconductor device produced by laminating a plurality of the semiconductor chips. Further, it becomes possible to securely connect the bonding wires, thereby providing the semiconductor device having high reliability.

Note that, the reverse wire bonding method is a method in which the bonding wire is connected to the substrate after the semiconductor chip is connected to the bonding wire. The forward wire bonding method is a method in which the order of connection is reversed.

It is preferable in the semiconductor device according to the present invention that the plurality of the semiconductor chips laminated on the substrate and the bonding wires are sealed by a resin, and, external connection terminals are formed on the side of the substrate opposite the semiconductor chips.

Thus, sealing by a resin protects the semiconductor chips and bonding wires. Further, the external connection terminal makes it easier to make external electrical connection for the semiconductor device.

It is preferable in the semiconductor device according to the present invention that the adhesion layer is formed between each of the plurality of the semiconductor chips.

By adhering the plurality of semiconductor chips through the adhesion layer, it becomes possible to easily laminate the semiconductor chips.

It is preferable in the semiconductor device according to the present invention that the adhesion layer is formed between the insulation layer and the semiconductor chip closer to the substrate.

With the foregoing arrangement, the adhesion layer can protect the bonding wires which are provided between the insulation layer and the semiconductor chip closer to the substrate.

It is preferable in the semiconductor device according to the present invention that the adhesion layer is an epoxy-containing resin.

The epoxy-containing resin is a thermosetting resin which cures after melting from solid into liquid in response to applied heat, thus, the bonding wires can be protected by curing the epoxy-containing resin after the semiconductor chips are adhered.

It is preferable in the semiconductor device according to the present invention that the thickness of the adhesion layer is greater than the height of the second bonding wire, relative to the surface of the semiconductor chip, which is connected via the electrode terminal.

This makes it possible to prevent contact between the bonding wires and the semiconductor chip which is adjacent to the semiconductor chip to which the bonding wires are connected, thereby preventing damage to the bonding wires which may be caused when the bonding wires contact the adjacent semiconductor chip.

It is preferable in the semiconductor device according to the present invention that an insulation resin layer is formed on the side of the semiconductor chip having the electrode terminals, excluding the area where the electrode terminals are provided.

Thus having the insulation resin layer prevents contact between the bonding wires and the semiconductor chip to which the bonding wires are connected via the electrode terminals. Namely, it is possible to prevent contact between the bonding wires and the semiconductor chip since the side of the semiconductor chip on which the electrode terminals are connected is covered with the insulation resin layer excluding the electrode terminals.

The semiconductor device according to the present invention can be manufactured through a method having the steps of: affixing a sheet of an insulation resin layer and an adhesion resin layer to a wafer on the insulation resin layer before the wafer is divided into semiconductor chips; dividing the wafer having the sheet affixed thereto into semiconductor chips by dicing; adhering the semiconductor chips having the adhesion layer affixed thereto on the adhesion layer to the semiconductor chip which is electrically connected to the substrate by bonding wires.

The semiconductor device according to the present invention can be manufactured through a method having the steps of: affixing a sheet of the insulation resin layer, followed by a sheet of the adhesion resin layer to the rear surface of a wafer, and thereafter dividing the wafer into the semiconductor chips by dicing; adhering the divided semiconductor chips having the adhesion layer affixed thereto on the adhesion layer to the semiconductor chip which is electrically connected to the substrate by bonding wires.

With the foregoing method, it becomes possible to easily and reliably manufacture the semiconductor device according to the present invention. Namely, it is possible to prepare the insulation layer and the adhesion layer simultaneously with the semiconductor chips in the process of dividing a wafer into semiconductor chips. Namely, the insulation layer, the adhesion layer and the semiconductor chips can be prepared at once. As a result, it becomes possible to create the insulation layer and the adhesion layer of the same size as the chip size of the semiconductor chip.

Therefore, it becomes possible to easily control the adhesion area, adhesive volume, and thickness of the adhesion layer, and, in turn, to manufacture the semiconductor device of the present invention both easily and reliably. Note that, in the present invention, "chip size" refers to the vertical and horizontal outer dimensions of a surface of the semiconductor chip with respect to the substrate or other semiconductor chips.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
    a substrate;
    a plurality of semiconductor chips laminated on the substrate;
    for each semiconductor chip, at least one bonding wire for electrically connecting an electrode terminal provided on the semiconductor chip to the substrate;
    an insulation layer which is provided between at least one of the bonding wires and the semiconductor chip which is laminated on the semiconductor chip to which the at least one bonding wire is electrically connected;
    an adhesion layer formed between a pair of the semiconductor chips; and
    wherein both the insulation layer and the adhesion layer are provided over an area of the electrode terminal to which the bonding wire is electrically connected.

2. A semiconductor device, comprising:
    a substrate;
    first and second semiconductor chips laminated on the substrate, wherein the second semiconductor chip is provided at least partially over the first semiconductor chip;
    at least a first bonding wire for electrically connecting an electrode terminal provided on the first semiconductor chip to the substrate;
    at least a second bonding wire for electrically connecting an electrode terminal provided on the second semiconductor chip to the substrate;
    an adhesion layer provided between the first and second semiconductor chips;
    an insulation layer provided between the first bonding wire and the second semiconductor chip which is laminated on the first semiconductor chip to which the first bonding wire is electrically connected, wherein both the insulation layer and the adhesion layer are provided over an area of the electrode terminal to which the first bonding wire is electrically connected.

3. The semiconductor device of claim 2, wherein the insulation layer comprises a polyimido-containing resin.

4. The semiconductor device of claim 2, wherein said adhesion layer and said insulation layer are in direct contact with each other.

5. The semiconductor device set forth in claim 2, wherein: a thickness of the insulation layer is in a range of from not less than 15 $\mu$m and not more than 30 $\mu$m.

6. The semiconductor device set forth in claim 2, wherein: the electrode terminal is provided on a side of the semiconductor chips opposite the substrate.

7. The semiconductor device set forth in claim 2, wherein: areas of the semiconductor chips where the electrode terminal is provided overlap one another.

8. The semiconductor device set forth in claim 2, wherein: the semiconductor chips laminated on the substrate all have the same outer shape.

9. The semiconductor device set forth in claim 2, wherein: the bonding wire which is connected to the electrode terminal of the semiconductor chip which is directly mounted on the substrate is provided between the substrate and the semiconductor chip which is laminated on the semiconductor chip directly mounted on the substrate, in an area where the semiconductor chip which is laminated on the semiconductor chip directly mounted on the substrate does not overlap the semiconductor chip which is directly mounted on the substrate.

10. The semiconductor device set froth in claim 2, wherein: a bump is formed on the electrode terminal, and the bonding wire is connected through a reverse wire bonding method.

11. The semiconductor device set forth in claim 2, wherein: the plurality of semiconductor chips laminated on the substrate and the bonding wire are sealed by a resin, and external connection terminals are formed on a side of the substrate opposite the plurality of semiconductor chips.

12. The semiconductor device set forth in claim 2, wherein: the adhesion layer is made of thermosetting resin.

13. The semiconductor device set forth in claim 2, wherein: the adhesion layer is made of epoxy-containing resin.

14. The semiconductor device set forth in claim 2, wherein: a thickness of the adhesion layer is greater than a height of the bonding wire from a surface of the semiconductor chip to which the bonding wire is connected via the electrode terminal.

* * * * *